(12) United States Patent
Prieto et al.

(10) Patent No.: US 7,313,186 B2
(45) Date of Patent: Dec. 25, 2007

(54) METHOD AND APPARATUS FOR IMPLEMENTING WAVELET FILTERS IN A DIGITAL SYSTEM

(75) Inventors: Yolanda Prieto, Miami, FL (US); Jose I. Suarez, Coral Gables, FL (US); Yolanda M. Pirez, Davie, FL (US)

(73) Assignee: Motorola, Inc., Schaumburg, IL (US)

( * ) Notice: Subject to any disclaimer, the term of this patent is extended or adjusted under 35 U.S.C. 154(b) by 751 days.

(21) Appl. No.: 10/665,702

(22) Filed: Sep. 19, 2003

(65) Prior Publication Data

US 2004/0076234 A1 Apr. 22, 2004

Related U.S. Application Data

(62) Division of application No. 09/221,434, filed on Dec. 28, 1998, now Pat. No. 6,757,326.

(51) Int. Cl.
*H04B 1/66* (2006.01)
(52) U.S. Cl. .............................. 375/240.19; 375/240.11; 375/240.25; 375/245; 382/232
(58) Field of Classification Search ................ 375/245, 375/240.19, 240.25, 240.11; 704/501; 382/260, 382/232
See application file for complete search history.

(56) References Cited

U.S. PATENT DOCUMENTS

| | | | | | |
|---|---|---|---|---|---|
| 5,844,610 | A | * | 12/1998 | Perdrieau et al. | 375/240.11 |
| 5,848,164 | A | * | 12/1998 | Levine | 381/61 |
| 5,890,125 | A | * | 3/1999 | Davis et al. | 704/501 |
| 5,953,388 | A | * | 9/1999 | Walnut et al. | 378/4 |
| 6,128,346 | A | | 10/2000 | Suarez et al. | |
| 6,456,657 | B1 | * | 9/2002 | Yeap et al. | 375/240.12 |

OTHER PUBLICATIONS

Hartley; Optimization of Canonic Signed Digit Multipliers for Filter Design, Circuits and Systems, 1991, pp. 1992-1995, vol. 4.*

* cited by examiner

*Primary Examiner*—Mohammed Ghayour
*Assistant Examiner*—Leila Malek

(57) ABSTRACT

A digital data system (100) provides 1-D, 2-D and 3-D capability and multi-band channel capability. Improved filter banks are created by generating a filter bank having an analysis portion and synthesis portion and obtaining wavelet coefficients (302) for each portion. The wavelet coefficients are expressed in a format capable of canonical signed digit (CSD) representation, such as integers (302). The canonical signed digit (CSD) representation is controlled by a value, N, selected to control resolution of the CSD coding. Optimized CSD-coded wavelet coefficients are used as filters for data signals (318).

27 Claims, 6 Drawing Sheets

METHOD AND APPARATUS FOR IMPLEMENTING WAVELET FILTERS IN A DIGITAL SYSTEM

CROSS REFERENCE TO RELATED APPLICATION

This application is a divisional of U.S. application Ser. No. 09/221,434, filed on Dec. 28, 1998, now U.S. Pat. No. 6,757,326 by Yolanda Prieto et al., entitled "Method and Apparatus for Implementing Wavelet Filters in a Digital System," previously filed and assigned to Motorola, Inc.

TECHNICAL FIELD

This invention relates in general to data compression and particularly to digital data compression. Specifically, the invention relates to a method and apparatus that provides improved wavelet filter operation for digital data systems.

BACKGROUND

With the advent of technologies and services related to teleconferencing and digital image storage, considerable progress has been made in the field of digital signal processing. As will be appreciated by those skilled in the art, digital signal processing typically relates to systems, devices, and methodologies for generating a sampled data signal, compressing the signal for storage and/or transmission, and thereafter reconstructing the original data from the compressed signal. Critical to any highly efficient, cost effective digital signal processing system is the methodology used for achieving compression.

As is known in the art, data compression refers to the steps performed to map an original data signal into a bit stream suitable for communication over a channel or storage in a suitable medium. Methodologies capable of minimizing the amount of information necessary to represent and recover original data are desirable in order to lower computational complexity and cost. In addition to cost, simplicity of hardware and software implementations capable of providing high quality data reproduction with minimal delay are likewise desirable.

At present, the next standard of JPEG 2000 (Joint Photographic Experts Group) systems for still images proposes algorithms which use a wavelet to achieve decomposition of an input signal. In systems utilizing a wavelet, the data is typically divided through low pass and high pass filters. The implementation of wavelet filters is typically achieved using a filter bank and, in many instances, involves several levels of filtering. Filter bank operation is often implemented through numerous multiplications and additions between the wavelet coefficients and the input data. The process of implementing filter banks can be time consuming unless very fast multipliers are used. Such multipliers typically utilize parallel processing, which requires the use of fast clocks with higher current consumption as well as requiring larger chip areas in their implementation.

Some prior art filter banks have eliminated multipliers through the use canonical signed digit(s) (CSD). CSD is a powers of two representation of an integer (e.g., $9=2^3+2^0$). One such filter bank is described by Horng et al. in an IEEE article entitled "The Design of Low Complexity Linear-Phase FIR Filter Banks Using Powers-of-Two Coefficients with an Application to Subband Image Coding," Vol. 1, No. 4, December 1991. This prior art system develops a method for obtaining an optimal representation for the low pass filter and high pass filter in the filter bank. The authors' premise is how close the CSD representation of the filter coefficients is to the infinite precision design. Hence, based on this language, Horng et al., have developed "an objective function that will yield good filtering performance while adhering to" a constraint equation which embodies the well known perfect reconstruction condition. This constraint equation is based on an imposed pure-delay requirement implied by perfect reconstruction. To overcome the non-linearity in this equation, low pass filter coefficients are first restricted to CSD without any constraint, then a suitable set of high pass CSD coefficients are obtained by using a complex optimization algorithm such that the constraint equation is met.

This invention further reduces the set of the optimal representation of CSD coded coefficients of the filters in the filter bank, by adaptively selecting a subset of the number of CSD terms.

While certain wavelet transforms are closely linked to the two-band (or two-channel) perfect reconstruction (i.e., lossless) filter bank, this is not always the case. Wavelet based CODECs are often used in both lossless (perfect reconstruction) and lossy (for example systems involving quantization) digital data systems. Quantization refers to the technique of taking a bit stream of data and compressing it for later reproduction. In most data compression applications, the presence of quantization in a lossy system implies a rate-distortion performance, which usually bounds the quality of the recovered image. Thus, a pure-delay requirement on the design and representation of the wavelet coefficients is too restrictive, often resulting in implementations that are more complex than required. The further reduction in the number of terms used in the CSD representation proposed by this invention is based on a system, which includes some method for lossy coding.

There is a need for a method and apparatus which provides improved wavelet filtering for both lossy and lossless digital data systems. Such wavelets should be implemented so as to minimize current drain and reduce computational intensity.

DETAILED DESCRIPTION OF THE PREFERRED EMBODIMENT

Figure 1:
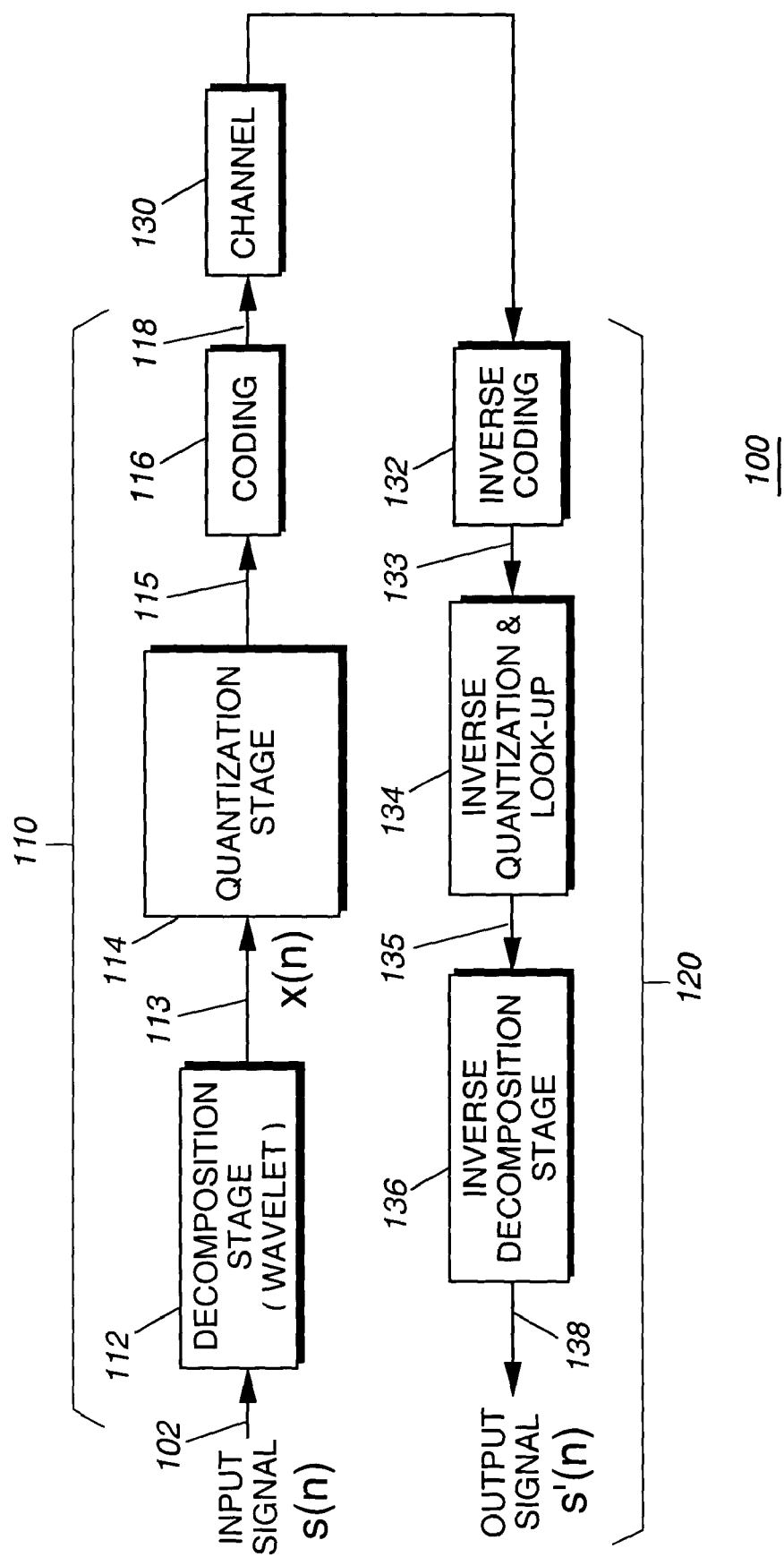
FIG. 1 is a block diagram of a lossy digital data system in accordance with a first embodiment of the invention.

While the specification concludes with claims defining the features of the invention that are regarded as novel, it is believed that the invention will be better understood from a consideration of the following description in conjunction with the drawing figures, in which like reference numerals are carried forward.

The invention to be described herein improves the decomposition stage in a digital data system and can be applied to three-dimensional (3-D) systems, such as video, two-dimensional (2-D) systems, such as still images, as well as one-dimensional (1-D) systems, such as speech.

Referring now to FIG. 1, there is shown a block diagram of a digital data system, such as a CODEC system, in accordance with a first embodiment of the invention. In this first embodiment, there is no perfect reconstruction constraint imposed on the system 100. Data CODEC 100 includes an encoder 110 and a decoder 120. In accordance with the first embodiment, an input data signal s(n) 102, having a predetermined bit/sample resolution, goes through a transformation at decomposition stage 112. In accordance with the invention, decomposition stage 112 generates wavelet coefficients and converts them to a CSD format, wherein in the process of this conversion an optimal set of CSD coefficients are obtained. One of the methods that may be used in this conversion is described by Horng et al. in an IEEE article entitled "The Design of Low Complexity Linear-Phase FIR Filter Banks Using Powers-of-Two Coefficients with an Application to Subband Image Coding," Vol. 1, No. 4, December 1991. In accordance with the invention, the optimal representation of these CSD-coded wavelet coefficients is then processed, considering a lossy system, to further reduce adaptively the number of terms in the CSD representation. Once this is achieved the resulting wavelet filter is used for filtering the input signal 102 into the transformed signal x(n) 113.

The transformed signal x(n) 113 goes through a quantization stage 114 for further compression. The quantized compressed signal 115 is then coded through coding stage 116 preferably using one of a variety of well known coding schemes. A coded compressed signal 118 is then communicated over or stored to channel 130. At the receiving end, decoder 120 employs an inverse coding stage 132, inverse quantization stage and look-up table 134, and an inverse decomposition stage 136 to recreate the input data signal s(n) as output data signal s'(n) 138.

Decomposition stage 112 preferably performs the data conversion through a wavelet transformation such as that proposed in the next standards for JPEG 2000 systems. The transformation used falls under what is called subband coding. In subband coding, whether 1-D, 2-D, or 3-D, the input data signal is repeatedly divided through a filter bank of low pass and high pass filters to generate a transformed output consisting of subbands. In accordance with the present invention, a series of wavelet coefficients of the filter bank are generated into a format, such as integer, floating point, rounded-off floating point, among others, which can then be converted into a CSD representation. Filtering of the input data signal is then performed using the CSD represented wavelet filter.

The wavelet transformation of the input data signal performed at decomposition stage 112 of the present invention helps achieve certain multi-resolutional capabilities and minimizes blocking effects in the case of image data. In systems where perfect reconstruction cannot be guaranteed, such as FIG. 1, the use of CSD representation applied to all wavelet coefficients provides improved bit rate, lower computational intensity and power drain, without degrading system signal-to-noise ratio.

Blocks 114, 116, 130, 132, and 134 of FIG. 1 may be implemented in a variety of configurations well known or to come. There are several algorithms that may be used to achieve compression of a data signal at quantization stage 114. A well-known quantizer is the Lloyd-Max optimal quantizer using nearest neighbor, minimum squared error (MSE) rules to classify an input into a specified number of levels. Quantization can be achieved through a variety of other approaches including vector, scalar, rounding, truncation, and trellis coded quantization (TCQ) among other methods known or to come. Coding stage 116 and inverse coding stage 132 can operate through a variety of coding schemes including but not limited to arithmetic, Huffman, or other well known coding and decoding schemes. Channel 130 may include a wireless, wireline, acoustic, or optically linked path such as, for example, a radio frequency (RF) or fiber optic transmission path. The channel 130 may likewise be a storage medium such as those now known or later developed. Inverse quantization stage 134 can operate through a variety of inverse quantization schemes including but not limited to trellis coded quantization, scalar, vector, or others to come. The inverse quantization stage 134 decompresses the compressed decoded signal 133 thereby producing a decompressed signal 135.

In accordance with the present invention, the inverse decomposition stage 136 is formed as an inverse discrete wavelet transform (inverse DWT). In accordance with the present invention, the inverse decomposition stage 136 utilizes the filter bank of CSD-coded wavelet coefficients in order to inverse transform the decompressed signal 135 and generate the output signal 138 substantially similar to the input data signal 102.

Figure 2:
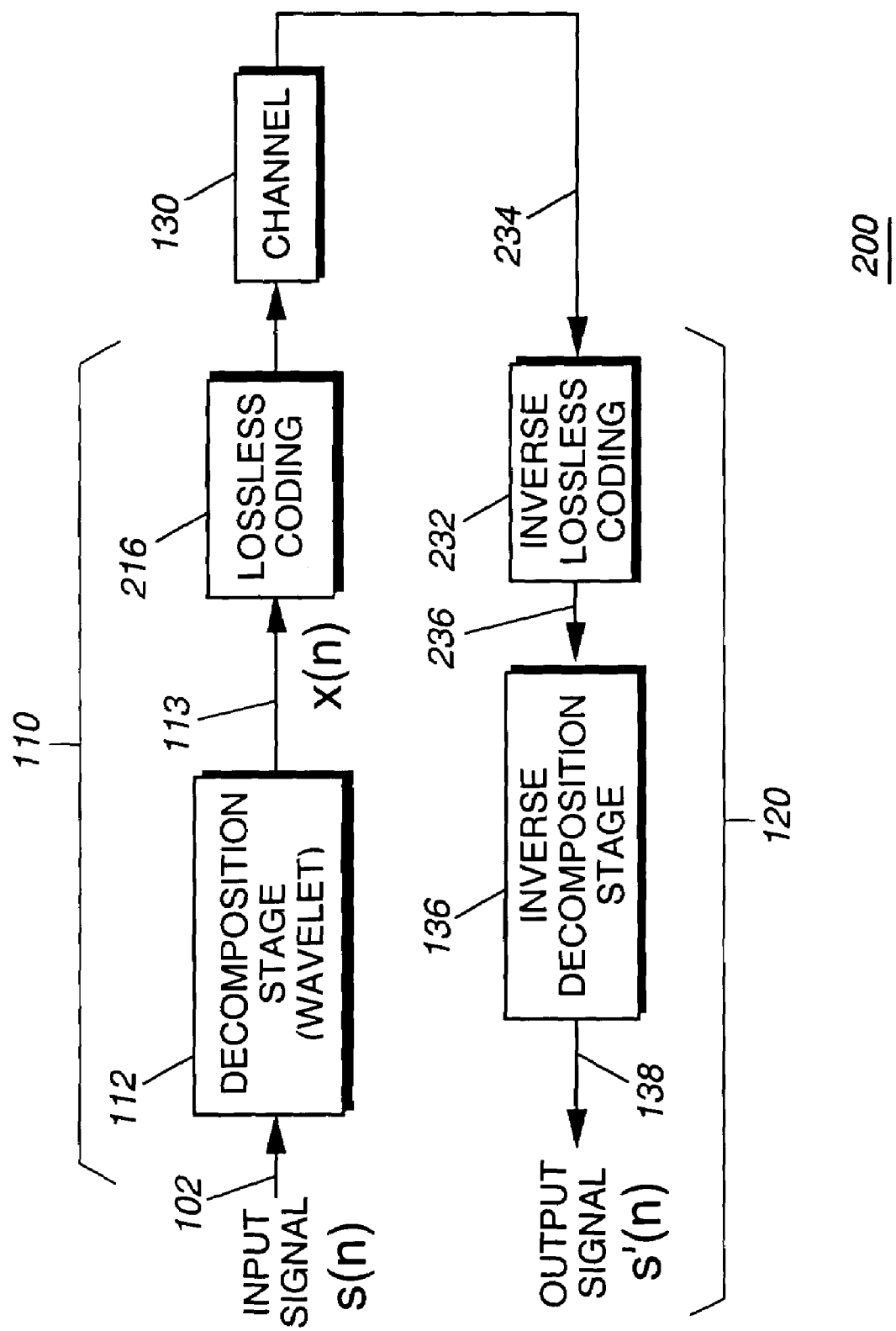
FIG. 2 is a block diagram of a lossless digital data system in accordance with a second embodiment of the invention.

Wavelet filter banks can also be used in perfect reconstruction systems (i.e. those systems where the output signal differs only from the input signal by a constant or pure delay). FIG. 2 is a digital data system 200 in accordance with a second embodiment of the invention. In system 200 the quantization stages of FIG. 1 have been eliminated, and like numerals have been carried forward from FIG. 1 where appropriate.

System 200 includes a lossless coding stage 216 and an inverse lossless coding stage 232. The inverse lossless coding stage decodes the coded signal 234 into a decoded signal 236. In accordance with the second embodiment, CSD representation is applied to all wavelet coefficients obtained from the design of the forward discrete wavelet transform (DWT) and the inverse discrete wavelet transform (IDWT). In the decomposition stage 112, this DWT is represented by an analysis bank matrix, H, consisting of analysis low pass and high pass filters for the two-channel case, and similarly done for the multi-channel case. In accordance with the present invention, the inverse decomposition stage 136 performs the steps associated with the inverse discrete wavelet transform (IDWT). This IDWT is represented by a synthesis bank matrix, G, which in the two-channel filter bank consists of the synthesis low pass and high pass filters. The use of CSD representation applied to all wavelet coefficients provides reduced computational intensity and improved computational speed.

The decomposition stage 112 and inverse decomposition stage 136 utilizing CSD coding of wavelet coefficients, in accordance with the invention, can thus be applied to systems that may not include a quantization, but rather including lossless coding with the knowledge that perfect reconstruction will not be achieved due to the limitation imposed by decomposition stage 112.

The preferred embodiment of the invention is a system where quantization of the CSD-coded wavelet coefficients occurs. In this lossy system, the powers-of-two representation of the wavelet coefficients is not the limiting factor in the system signal-to-noise performance. For this reason, the method used to CSD code the coefficient need not be complex or cumbersome but rather a simpler method whose fast convergence is determined by known, user defined criteria, such as acceptable system peak signal-to-noise ratio (PSNR), bit rate, and computational intensity.

As mentioned previously, in systems utilizing a quadrature filter bank, the data is typically divided through low pass and high pass filters. In accordance with the present invention, adaptive canonical signed digit representation is applied to the entire wavelet coefficients to achieve an image that has good peak signal to noise ratio (SNR) and good bit rate (entropy). This is achieved by a method of filtering the data signal 102 which, in accordance with the present invention, comprises the steps of generating a series of wavelet coefficients that are integers, representing these integers in a canonical signed digit (CSD) form (i.e., powers of two), and filtering the data signal according to the CSD representation.

For example, without any loss of generality, in the one-dimensional case:

$$x(n) = \sum_{k=o}^{K-1} h_k(n)s(n) \quad (1)$$

where:
s(n) are the input data samples;
h(n) are the k-coefficients of a filter impulse response represented in CSD form;
x(n) is the filtered input (i.e. output of the decomposition stage 112)

After finding the Z-transform of equation (1) and representing it in matrix form, the following is obtained:

$$X(z)=H(z)S(z) \quad (2)$$

A simple extension can be made for two-dimensional; and three-dimensional cases if separable transforms are assumed.

For the finite impulse response (FIR) case, the filter coefficients are expressed in integer values as:

$$H(z)=1/\Delta(b_o+b_1z^{-1}+b_2z^{-2}+\ldots+b_kz^{-k}) \quad (3)$$

where
$b_i$ are integer values for i=0,1, ... k
$\Delta=2^p$ (exact power of two)
In general each bi is represented in powers of two as:

$$b_i \rightarrow s(2^p) \quad (4)$$

where s is the sign bit; and
p is the power.
Specifically, each integer coefficient, $b_i$, can be expressed by its power-of-two representation given by:

$$b'_i = \sum_{n=o}^{N-1} a(n)2^{p(n)}, i = o, i, \ldots, k \quad (5)$$

where:
a(n)=−1, 0, 1;
N=number of terms used to represent each integer coefficient; and p(n)=0,1,2, ... N−1 represents the power-of-two (e.g., $2^0$ for p(n)=0)
$b_i'$ is the i-th integer coefficient which, given a sufficiently large value of N, can either minimize or zero the error. The error is defined as the difference between the exact value wavelet coefficient $b_i$ and its approximated value $b_i'$.

The step of filtering comprises the step of convolving the data input with the CSD-coded wavelet coefficients. Multiplication reduces to simple shifts.

In accordance with the present invention, the value of N (in equation 5) may be selected and optimized independently for each coefficient by the use of adaptive CSD coding; that is, depending on the importance of the wavelet coefficient, computational intensity, output image signal-to-noise ratio, and image visual quality. This is advantageous because some coefficients may be more significant and to these a larger value N may be assigned in order to obtain an exact representation. The significance of the coefficients can be determined, in accordance with the present invention, based on their energy and their corresponding subband. There are various known algorithms that can be used to represent an integer as the sum of signed or unsigned powers-of-two, as well as providing it to its nearest power-of-two representation. Selecting a particular algorithm will depend on the hardware or software implementation and its complexity.

Figure 3:
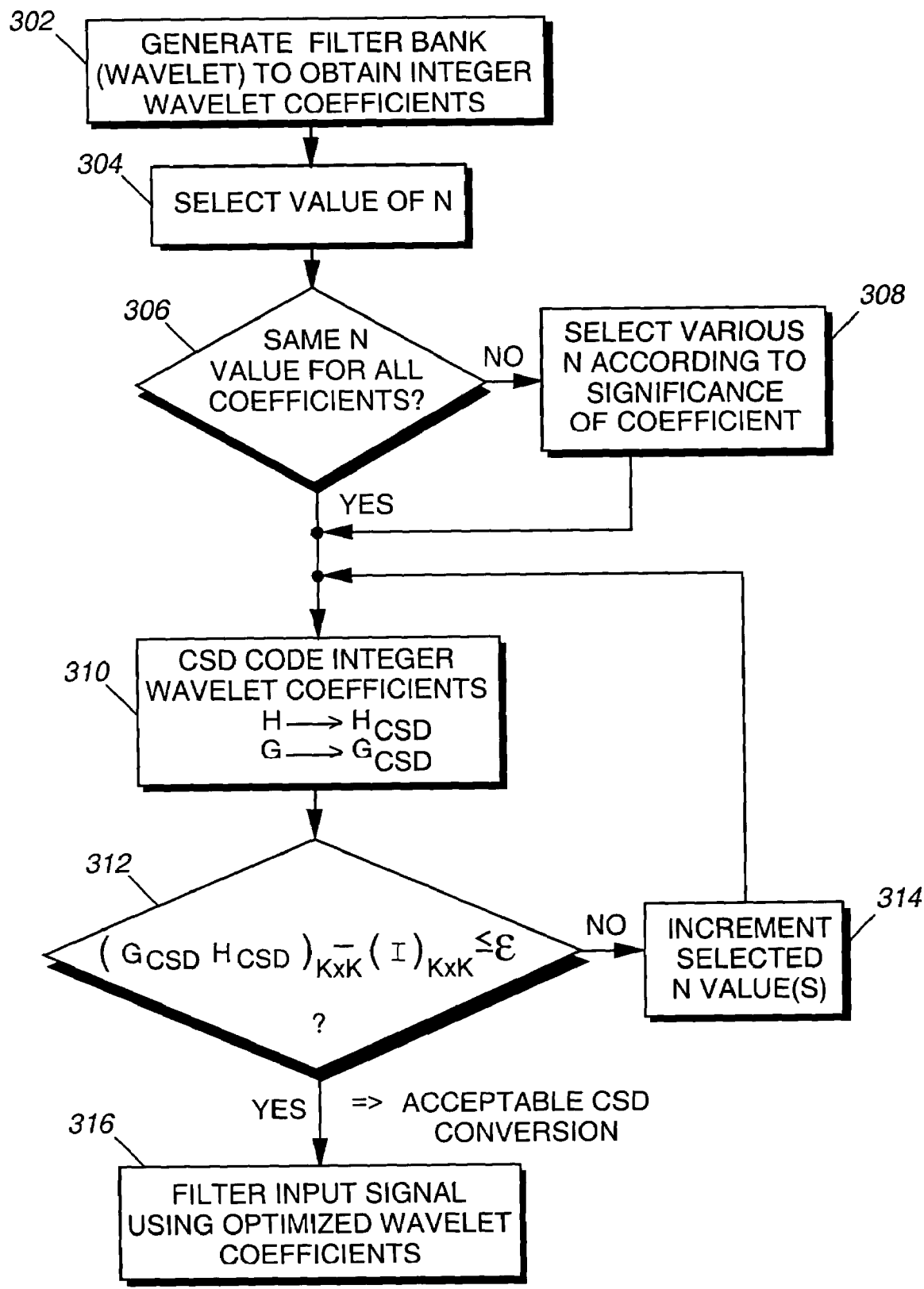
FIG. 3 is a flowchart of a method of CSD-coding wavelet coefficients to obtain an optimized filter for a decomposition stage in accordance with the present invention.

In accordance with the present invention, FIGS. 3, 4A, 4B, and 5 represent various, but are not limited to, possible CSD coding methods of integer discrete wavelet transform coefficients for the optimization of overall system performance. Referring to FIG. 3, method 300 optimizes CSD conversion of a data signal, such as a finite input response (FIR) data signal, by optimizing the selection of the maximum number of terms, N, used to represent each wavelet integer coefficient.

Step 302 begins by generating a filter bank (wavelet) to obtain integer wavelet coefficients. This filter bank includes an analysis filter bank, H, and a synthesis filter bank, G. The H filter bank is used in the decomposition stage 112 and represents the wavelet matrix for the encoder portion 110 of FIGS. 1 and 2. The G filter bank is used in the inverse decomposition stage 136 and represents the wavelet matrix for the decoder side 120. Next, a value is selected for N at step 304, N being the number of terms used to represent each integer wavelet coefficient in a powers-of two representation.

Step 306 determines whether the same value of N is used for all coefficients of the analysis and synthesis wavelet filters and if not, then various values of N are selected according to the importance of the coefficient at step 308. The importance of the coefficient is determined by the energy associated with the coefficient's subband (i.e. Ns represents higher significant values of N, and NL represents lower significant values of N). If the same value of N is used at step 306, then the integer wavelet coefficients are coded using CSD at step 310 (i.e., H $\Rightarrow H_{CSD}$ and G$\Rightarrow G_{CSD}$).

Once the CSD-coding at step 310 is completed, the new coefficient values are substituted into their respective positions in the original analysis matrix, H, and synthesis matrix, G, to obtain new optimized matrices $H_{CSD}$ and $G_{CSD}$ whose components have been obtained using equation (5). The product of the coded analysis wavelet matrix $H_{CSD}$ and coded synthesis wavelet matrix $G_{CSD}$, represented by the K-by-K sized matrix product ($G_{CSD}H_{CSD}$) is then compared to an identically sized identity matrix $(I)_{K\text{-}by\text{-}K}$ at step 312.

For lossless systems and values of N so selected as to allow exact power-of-two representation of the original analysis (decomposition stage 112 of FIG. 1) and synthesis wavelet filter coefficients (inverse decomposition stage filter bank 136 of FIG. 1), the product $G_{CSD}H_{CSD}$ should equal $I_{K-by-K}$. In this case, the predetermined reconstruction error, $\epsilon$, defined as the allowable difference between the input data signal s(n) and the recovered or reconstructed output data signal s'(n), should be zero, assuming lossless channel. Note that for $\epsilon=0$, $G_{CSD}H_{CSD}=I_{K-by-K}$, and the system is lossless, thus s(n)=s'(n).

For lossy systems, the reconstruction error, $\epsilon$, will not be zero. However, taking only into consideration the decomposition stage (represented by its analysis low pass filters and analysis high pass filters in the matrix $H_{CSD}$) and the inverse decomposition stage (represented by its synthesis low pass filters and synthesis high pass filters in the matrix $G_{CSD}$) how small the reconstruction error, $\epsilon$, will be, will depend on how accurate the wavelet coefficients are CSD-coded, that is, it will depend on the value of N.

For lossy systems, where the quantization step may now be the limiting factor in the rate-distortion performance of the system, the value of N may be selected to allow a coarser power-of-two coefficient representation. If an unacceptable CSD conversion took place at step 312, the process moves to step 314 to increment the value of N. Steps 310, 312, and 314 are repeated until an accepted CSD conversion takes place. If a successful conversion takes place at step 312 then the step of filtering the input signal using the optimized CSD-coded wavelet coefficients occurs at step 316.

Figure 4A:
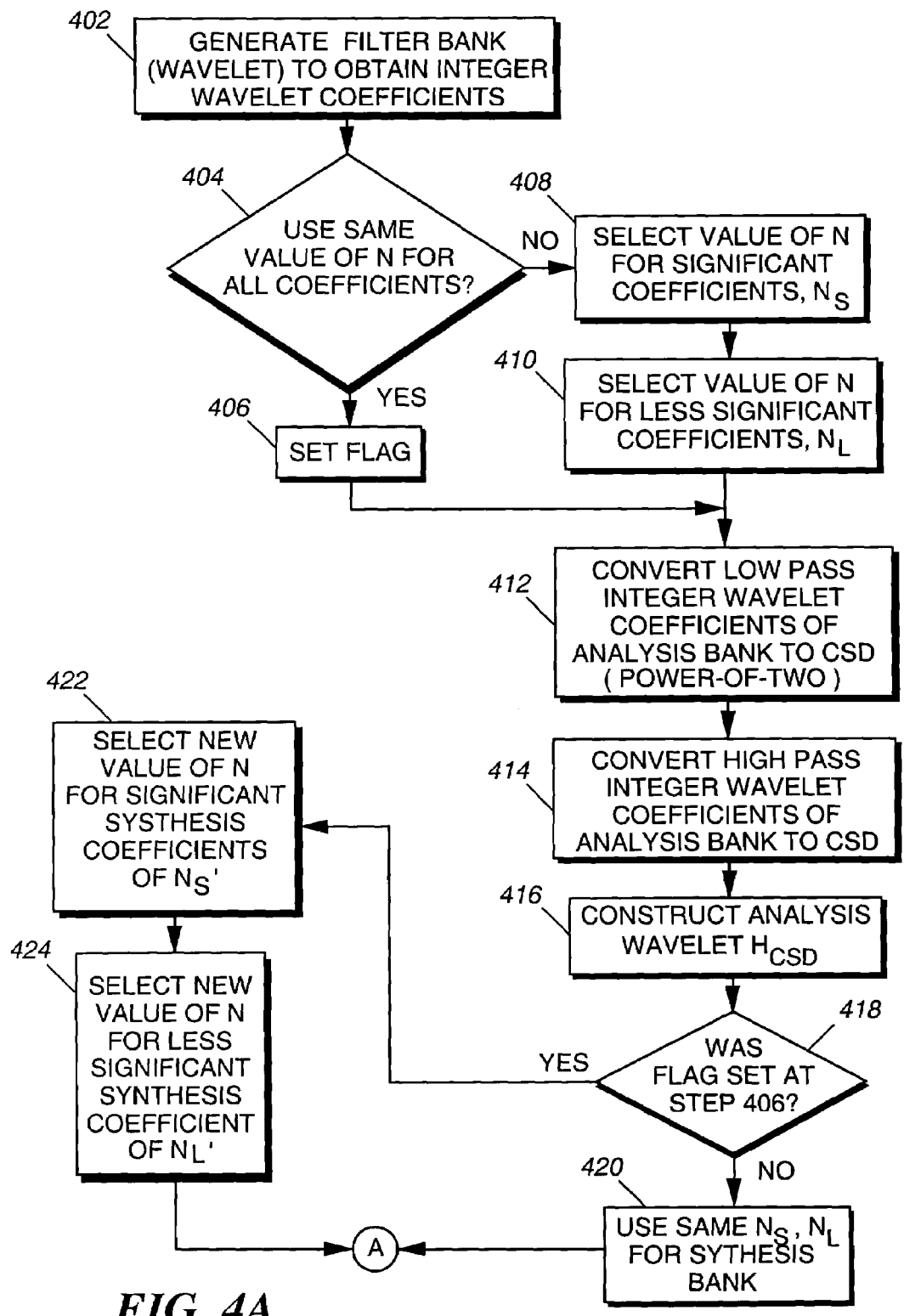
FIGS. 4A and 4B are flowcharts of steps performed in a decomposition stage showing an example of a more detailed implementation of the flowchart of FIG. 3 in accordance with the present invention.
Figure 4B:
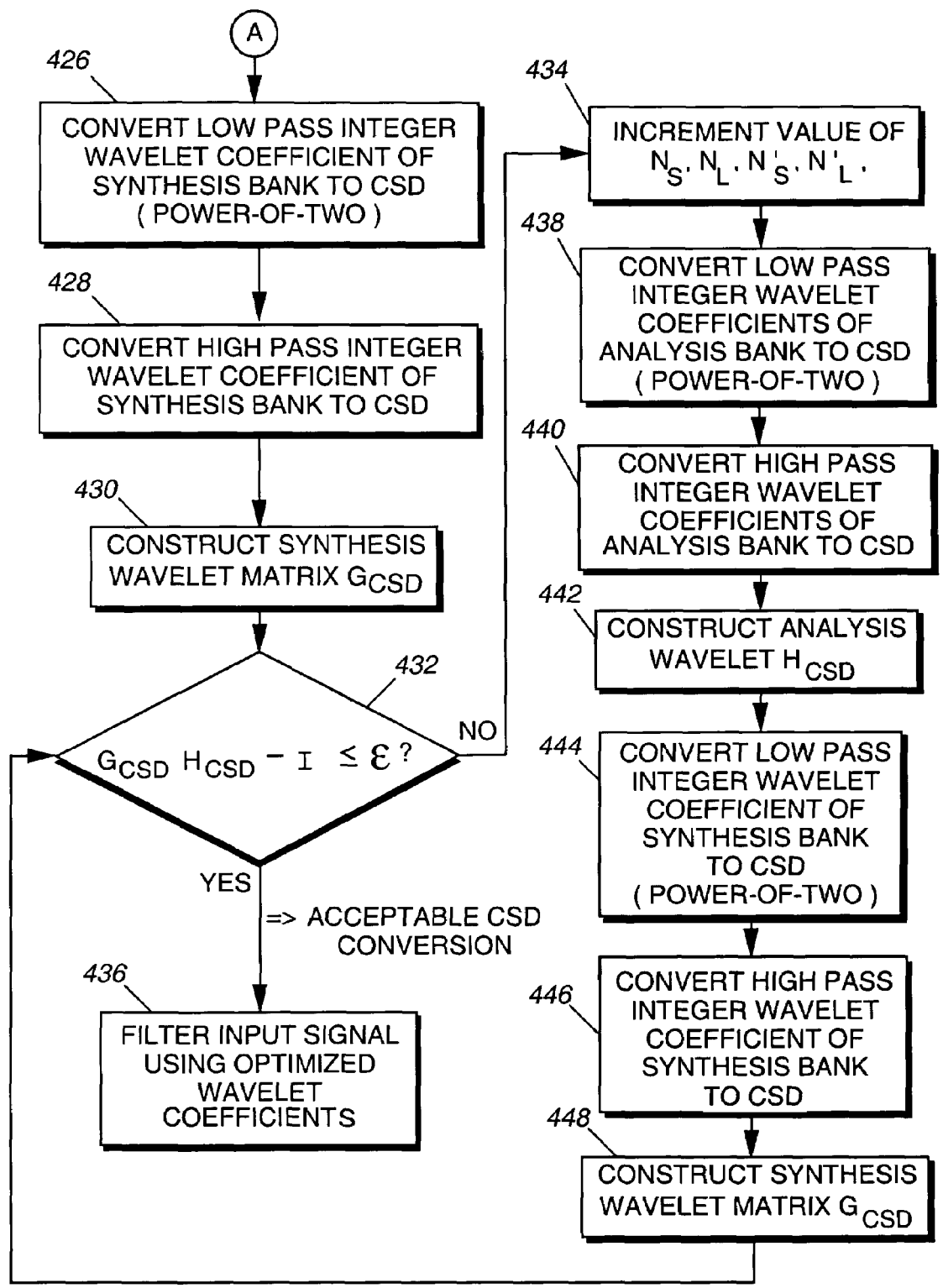

FIGS. 4A and 4B are examples of a more detailed implementation of the flowchart of FIG. 3. Step 402 begins by generating a filter bank to obtain integer wavelet coefficients. The integer wavelet is designed for both the analysis bank, H, used in the decomposition stage, and the synthesis bank, G, used in the inverse decomposition stage. Step 404 determines whether the same value of N is used for all coefficients of the analysis and synthesis wavelet filters. If so, a flag is set at step 406.

If the same value of N was not determined at step 404, then a value is selected for N for significant coefficient(s), $N_S$, at step 408, and a value is selected for N for less significant coefficient(s), $N_L$, at step 410. Significant coefficients may be those corresponding to the lower frequency subbands, whereas less significant coefficients may be those corresponding to the higher frequency subbands.

Next, low pass integer coefficients of the analysis bank are converted to CSD (power-of-two representation) at step 412, and, high pass integer wavelet coefficients of the analysis bank are converted to CSD at step 414, preferably using equation (5), but not limited to it. At step 416, an analysis wavelet matrix, $H_{CSD}$, is constructed by substituting the coded coefficients into the original wavelet matrix H whose components were the original integer filter coefficients.

Step 418 determines whether the flag was set at step 406, and if so, this implies that the synthesis bank, G, will use a different (either more precise or coarser) number of terms in the power-of-two terms representation of the synthesis coefficients, than those employed in the analysis CSD coding conversion. For this case, new values of N are selected for significant coefficients, $N_s$, referred to as $N_s'$, and for less significant coefficients, $N_L$, referred to as $N_L'$ at steps 422, 424 respectively. If the flag was not set at step 418, synthesis bank, G, will use the same value, N, as in the analysis bank as shown at step 420.

At steps 426 and 428 the low pass and high pass wavelet coefficients of the synthesis bank, G, are CSD-coded to yield the coded synthesis matrix, $G_{CSD}$, at step 430.

At step 432, the product of the coded analysis wavelet matrix, $H_{CSD}$, and the coded synthesis wavelet matrix, $G_{CSD}$, represented by the k-by-k sized matrix product $G_{CSD}H_{CSD}$ is compared to the identity matrix $I_{k-by-k}$ (i.e., $G_{CSD}H_{CSD}-I<\epsilon$). If the difference is smaller than the predetermined reconstruction error, $\epsilon$, the CSD coding of all the coefficients in the decomposition stage (analysis bank) 112 and the inverse decomposition stage (synthesis bank) 136 yielded an acceptable powers-of-two conversion. Then, input signals 102 and 135 (for the lossy signal compression case FIG. 1) and signals 102 and 236 (for the lossless case FIG. 2) are ready to be filtered using the optimized CSD-coded wavelet coefficients.

If, at step 432, the difference between the matrix product $G_{CSD}H_{CSD}$ and the identity matrix, I, is greater than the reconstruction error, $\epsilon$, then the value(s) of the number of terms ($N_s$, $N_L$, $N_s'$, and $N_L'$) to be used in the powers-of-two representation are incremented at step 434. The incremented values are sent through steps 438, 440, 442, 444, 446, and 448 (repeating the process of steps 412, 414, 416, 426, 428, and 430 with the incremented N values) in order to obtain an updated matrix product for step 432. This loop is repeated until step 432 determines that an acceptable reconstruction error has been obtained, (i.e., that an acceptable CSD conversion has taken place). The final step filters the input signal using the optimized wavelet coefficients at step 436.

Figure 5:
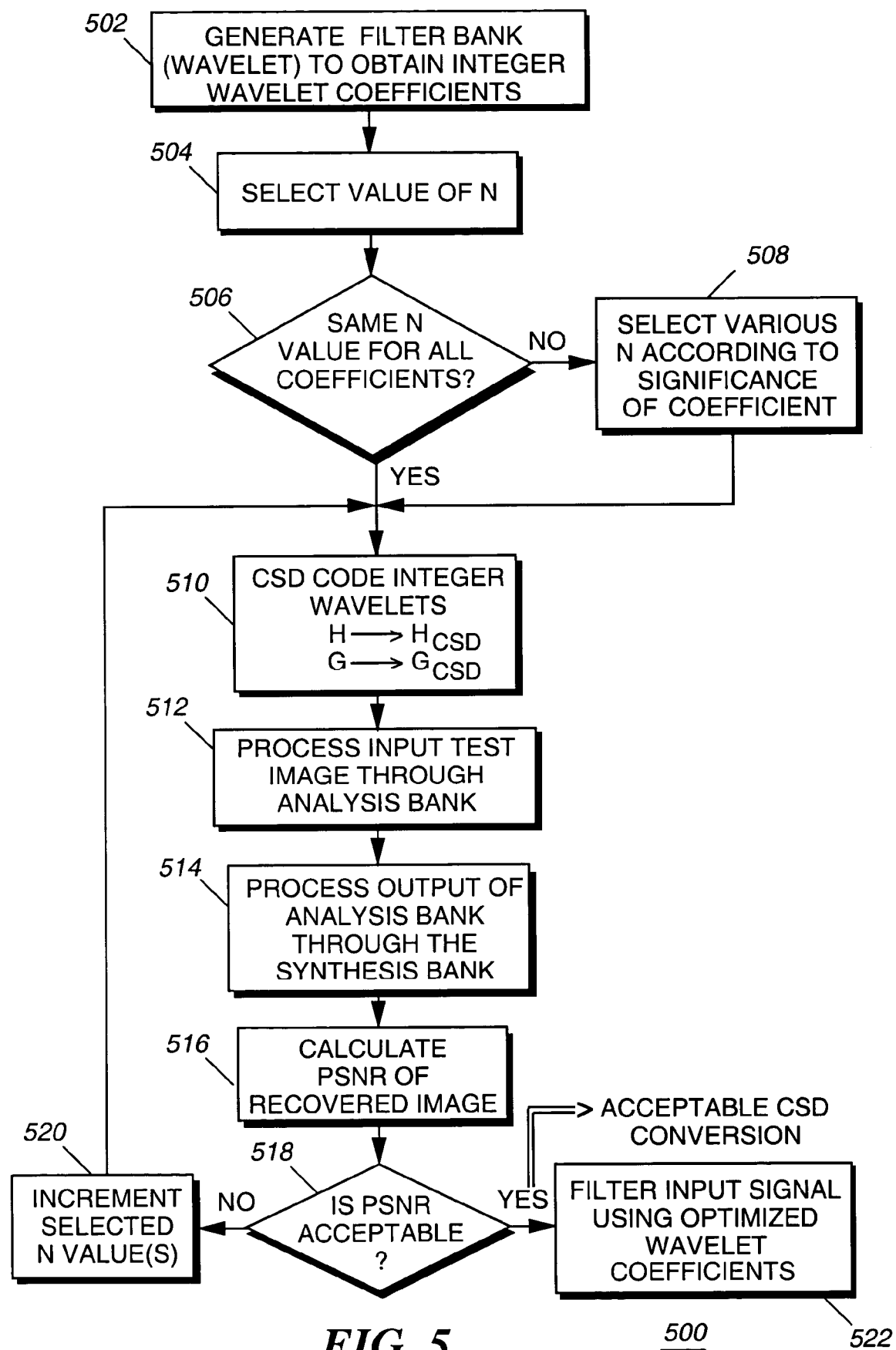
FIG. 5 is a flowchart of steps performed in a decomposition stage in which the integer wavelet coefficients are CSD-coded by optimizing signal-to-noise ratio in accordance with an alternative embodiment of the invention.

FIG. 5 is a flowchart of a method 500 of optimizing CSD conversion of FIR integer wavelet coefficients in accordance with another embodiment of the invention. In this embodiment of the invention, the PSNR is optimized based on an input test image. Steps 502-510 are the same as 302-310 of FIG. 3.

Step 512 processes the test image, $S_T(z)$, through an analysis bank [i.e., $H_{CSD}(z)S_T(z)H'_{CSD}(z)=X_T(z)$]. In this step the $H'_{CSD}(z)$ is the transposed matrix of $H_{CSD}(z)$.

Next, the output $X_T(z)$ of the analysis bank gets processed through the synthesis bank at step 514 [i.e. $G'_{CSD}(z)X_T(z)G_{CSD}(z)=S_T(z)$], where $S_T(z)$ is the recovered test image.

The PSNR of the recovered image $S_T(z)$ is then calculated at step 516. The PSNR is then compared to a predetermined threshold of acceptable degradation. If the PSNR is determined to be unacceptable at step 518, then the selected N value(s) are incremented at step 520. If the PSNR is determined to be acceptable at step 518, then an acceptable CSD conversion has taken place, and the input signal(s) are now filtered using optimized CSD-coded wavelet coefficients at step 522.

The adaptive CSD coding described in flowcharts 300, 400, and 500 is described in terms of integer wavelet coefficients. Alternatively, the CSD coding can be implemented with floating point wavelet coefficients, rounded-off wavelet coefficients, or truncated wavelet coefficients instead of the integer wavelet coefficients specified in steps 302, 402, and 502.

Accordingly, there has been provided an apparatus and method of providing optimized filter banks for use in the decomposition stage of a digital data system. The wavelet filters of the present invention are designed in context of the entire data system and allow for a multiplierless system. The filter bank of the present invention provides the advantages of 1-D, 2-D, and 3-D filtering capability and can be used, but is not limited, to FIR and IIR filters in two-channel and multi-channel applications.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method for decomposing and inverse decomposing data signals in a digital data system, comprising the steps of:
receiving an input data signal through a decomposition stage of the digital data system;
generating a series of wavelet coefficients for an analysis filter bank and a synthesis filter bank;
selecting a value, N, to represent the number of powers-of-two terms to represent the wavelet coefficients;
Canonical Signal Digit (CSD) coding the wavelet coefficients based on the selected value of N;
adjusting the value of N depending on a predetermined threshold to obtain optimized CSD-coded wavelet coefficients for the analysis filter bank and the synthesis filter bank;
filtering the input data signal using the optimized CSD-coded wavelet coefficients of the analysis filter bank in the decomposition stage of the digital data system;
generating a compressed data signal from the filtered input data signal in a quantization stage of the digital data system;
coding the compressed data signal into a compressed coded signal in a coding stage of the digital data system;
decoding the compressed coded signal and generating a compressed decoded signal in an inverse coding stage of the digital data system;
generating a decompressed data signal from the compressed decoded signal in an inverse quantization stage of the digital data system;
filtering the decompressed data signal using the optimized CSD-coded wavelet coefficients of the synthesis filter bank in an inverse decomposition stage of the digital data system to generate an output signal substantially similar to the input data signal.

2. The method of claim 1, wherein the series of wavelet coefficients for the analysis filter bank and the synthesis filter bank are, prior CSD-conversion, integer wavelet coefficients.

3. The method of claim 1, wherein the series of wavelet coefficients for the analysis filter bank and the synthesis filter bank are, prior CSD-conversion, truncated wavelet coefficients.

4. The method of claim 1, wherein the series of wavelet coefficients for the analysis filter bank and the synthesis filter bank are, prior CSD-conversion, rounded-off wavelet coefficients.

5. The method of claim 1, wherein the series of wavelet coefficients for the analysis and the synthesis filter bank are, prior CSD-conversion, floating point wavelet coefficients.

6. The method of claim 1, wherein the predetermined threshold is based on a predetermined reconstruction error.

7. The method of claim 1, wherein the predetermined threshold is based on a predetermined test image.

8. The method of claim 1, wherein the step of selecting the value of N further comprises the step of determining whether the same value of N is selected for the analysis filter bank as for the synthesis filter bank.

9. The method of claim 8, wherein the step of selecting the value of N further comprises the step of selecting the value for N according to the significance of the wavelet coefficient.

10. The method of claim 8, wherein the predetermined threshold is based on a predetermined reconstruction error.

11. The method of claim 8, wherein the predetermined threshold is based on a predetermined test image.

12. The method of claim 1, wherein the step of generating the series of wavelet coefficients comprises the step of generating a series of integer wavelet coefficients.

13. The method of claim 1, wherein the step of generating the series of wavelet coefficients comprises the step of generating a series of truncated wavelet coefficients.

14. The method of claim 1, wherein the step of generating the series of wavelet coefficients comprises the step of generating a series of rounded-off wavelet coefficients.

15. A method of forward and inverse decomposing an input data signal and a compressed data signal in a lossy digital data system, comprising the steps of: receiving an input signal through the a decomposition stage of the digital data system; generating a series of wavelet coefficients for an analysis filter bank as part of an encoder stage of the digital data system; generating a series of wavelet coefficients for a synthesis filter bank as part of the decoder stage of the digital data system; representing the wavelet filter coefficients for the analysis filter bank as canonical signal digit (CSD) thereby forming a CSD-coded optimal representation of the analysis filter; representing the wavelet filter coefficients for the synthesis filter bank as canonical signal digit (CSD) thereby forming a CSD-coded optimal representation of the synthesis filter; selecting a value, Ma, to represent the resulting number of CSD-coded coefficients from the optimal representation for the analysis filter, adaptively adjusting the value of Ma to reduce the number of CSD-coded coefficients from the optimal representation of the analysis filter; performing a forward signal decomposition for the input data signal using the CSD-coded analysis filter; and performing an inverse signal transformation on the compressed data signal using the CSD-coded synthesis filter to generate an output signal substantially similar to the input data signal.

16. The method according to claim 15, whereby the process of adaptively adjusting the value of Ma is based on a measure of accepted recovered image quality.

17. The method according to claim 15, further comprising the step of:
selecting a value, Ms, to represent the resulting number of CSD-coded coefficients from the optimal representation of the synthesis filter;
adaptively adjusting the value of Ms to reduce the number of CSD-coded coefficients from the optimal representation of the synthesis filter.

18. The method according to claim 17, whereby the process of adaptively adjusting the value of Ms is based on a measure of accepted recovered image quality.

19. The method according to claim 15, where the step of selecting the value of Ma further comprises the step of adjusting its value according to the significance of the wavelet coefficient.

20. The method according to claim 15, wherein the step of selecting the value of Ma further comprises the step of adjusting its value according to the significance of the subband.

21. The method according to claim 15, where in the step of selecting the value of Ma, further comprises the step of setting Ma to zero when processing the lowest frequency subband in a subband coding system.

22. The method according to claim 15, further comprising a step of selecting a value, Na, to represent the number of terms for each of the Ma selected number of CSD-coded coefficients of the analysis filter.

23. The method according to claim 17, wherein the step of selecting the value of Ms, further comprises the step of adjusting its value according to the significance of the wavelet coefficients.

24. The method according to claim 17, wherein the step of selecting the value of Ms, further comprises the step of adjusting its value according to the significance of the subband.

25. The method according to claim 17, wherein the step of adjusting the value of Ms, further comprises the step of setting Ms to zero when processing the lowest frequency subband.

26. The method according to claim 17, further comprising a step of selecting a value, Ns, to represent the number of terms for each of the Ms selected number of CSD-coded coefficients of the synthesis filter.

27. The method according to claim 22, wherein the step of selecting the value of Na, farther comprises the step of adjusting its value according to the significance of the subband.

* * * * *